United States Patent
Bringivijayaraghavan et al.

(10) Patent No.: US 10,176,857 B1
(45) Date of Patent: Jan. 8, 2019

(54) READ AND WRITE SCHEME FOR HIGH DENSITY SRAM

(71) Applicant: GLOBALFOUNDRIES INC., Grand Cayman (KY)

(72) Inventors: Venkatraghavan Bringivijayaraghavan, Cheyyar (IN); Sathisha Nanjundegowda, Channarayapatna (IN)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/630,466

(22) Filed: Jun. 22, 2017

(51) Int. Cl.
G11C 8/16 (2006.01)
H03K 19/177 (2006.01)

(52) U.S. Cl.
CPC ........... G11C 8/16 (2013.01); H03K 19/1776 (2013.01)

(58) Field of Classification Search
CPC .............................. G11C 8/16; H03K 19/1776
USPC ........................................................ 365/51
See application file for complete search history.

(56) References Cited

U.S. PATENT DOCUMENTS

| | | |
|---|---|---|
| 5,831,315 A | 11/1998 | Kengeri et al. |
| 6,111,780 A | 8/2000 | Bertin |
| 6,266,264 B1 | 7/2001 | Proebsting |
| 7,675,124 B2 | 3/2010 | Liaw |
| 7,900,178 B2 | 3/2011 | Culp et al. |
| 8,370,557 B2 | 2/2013 | Dama et al. |
| 9,183,922 B2* | 11/2015 | Yang ................. G11C 11/419 |
| 9,508,405 B2* | 11/2016 | Jain .................... G11C 7/12 |
| 9,520,178 B2 | 12/2016 | Iyer et al. |
| 2006/0155938 A1* | 7/2006 | Cummings .......... G11C 7/1048 711/149 |
| 2006/0221945 A1* | 10/2006 | Chin .................. H04L 49/103 370/381 |
| 2010/0161892 A1* | 6/2010 | Dama .................. G11C 7/1075 711/104 |
| 2015/0029782 A1 | 1/2015 | Jung et al. |
| 2017/0194046 A1* | 7/2017 | Yeung, Jr. ............ G11C 11/418 |

OTHER PUBLICATIONS

TW Office Action dated Apr. 2, 2018, in related Taiwan Application No. 106129745, 10 pages.
Notice of Allowance dated Jul. 25, 2018 in related TW Application No. 106129745, 4 pages.

* cited by examiner

Primary Examiner — Son Mai
Assistant Examiner — Muna A Techane
(74) Attorney, Agent, or Firm — Michael LeStrange; Andrew M. Calderon; Roberts Mlotkowski Safran Cole & Calderon, P.C.

(57) ABSTRACT

The present disclosure relates to a structure which includes a dual write bit switch device which includes a plurality of bit switch devices positioned at different positions of a memory cell array, and which is configured to enable write operations at a specified number of cells per bit line of the memory cell array.

20 Claims, 3 Drawing Sheets

US 10,176,857 B1

READ AND WRITE SCHEME FOR HIGH DENSITY SRAM

FIELD OF THE INVENTION

The present disclosure relates to a read and write scheme for a high density static random access memory (SRAM), and more particularly, to a read and write scheme for a high density SRAM to improve array write and read cycle time.

BACKGROUND

Memory chips comprise an array of memory cells which are interconnected by bit lines and word lines. The word lines and bit lines are used to read and write binary values to each of the memory cells. Each of the memory cells represents a bit of information. Since each memory cell represents a bit of information and may be connected to other circuitry, it is desirable that the electrical and operational characteristics of all memory cells be consistent.

The operational and electrical characteristics of memory cells vary depending on where a memory cell is located within a layout of the memory array. For example, memory cells along an edge of the memory array may have different electrical and operational characteristics than memory cells located in the inner region of the memory array. Therefore, a memory array may not have consistent electrical and operational characteristics throughout the memory chip.

In high density technologies (e.g., 7 nanometer technology or lower), each metal layer of a static random access memory (SRAM) is very resistive. Further, in the SRAM, a bit line (BL) is routed to a M0 metal layer (i.e., the lowest metal layer in the SRAM) for read and write operations. Therefore, a RC time constant (i.e., a time constant of a RC circuit which is a product of the RC circuit resistance and the RC circuit capacitance) of the bit line (BL) restricts a maximum number of cells per bit line (CPBL) of a memory bank in the SRAM. Further, after several read and write operations are performed, the RC time constant degrades read and write cycle times.

SUMMARY

In an aspect of the disclosure, a structure includes a dual write bit switch device which includes a plurality of bit switch devices positioned at different positions of a memory cell array, and which is configured to enable write operations at a specified number of cells per bit line of the memory cell array.

In another aspect of the disclosure, a structure includes a dual write bit switch device which includes a first bit switch device and a second bit switch device positioned at different locations with respect to a memory cell array, the dual bit switch device being configured to enable write operations at a specified number of cells per bit line of the memory cell array in a static random access memory (SRAM).

In another aspect of the disclosure, a method includes setting up at least one write operation for a dual write bit switch device, and performing the at least one write operation at a specified number of cells per bit of a memory cell array after setting up of the at least one write operation for the dual write bit switch device.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to a read and write scheme for a high density static random access memory (SRAM), and more particularly, to a read and write scheme for a high density SRAM to improve array write and read cycle time. The present disclosure relates to providing a dual write bit switch (DWBS) scheme that will enable write operations to occur with a higher number of cells per bit line (CPBL). Further, the DWBS scheme improves memory density and can also improve yield. For example, yield is improved by providing a lower voltage operation than a conventional SRAM. The DWBS scheme of the present disclosure will also enable faster array read and write cycle times. Moreover, although the present disclosure relates to SRAM, one of ordinary skill in the art would understand that embodiments are not limited to such memory and can be applicable to other memory types (e.g., DRAM).

Figure 1:
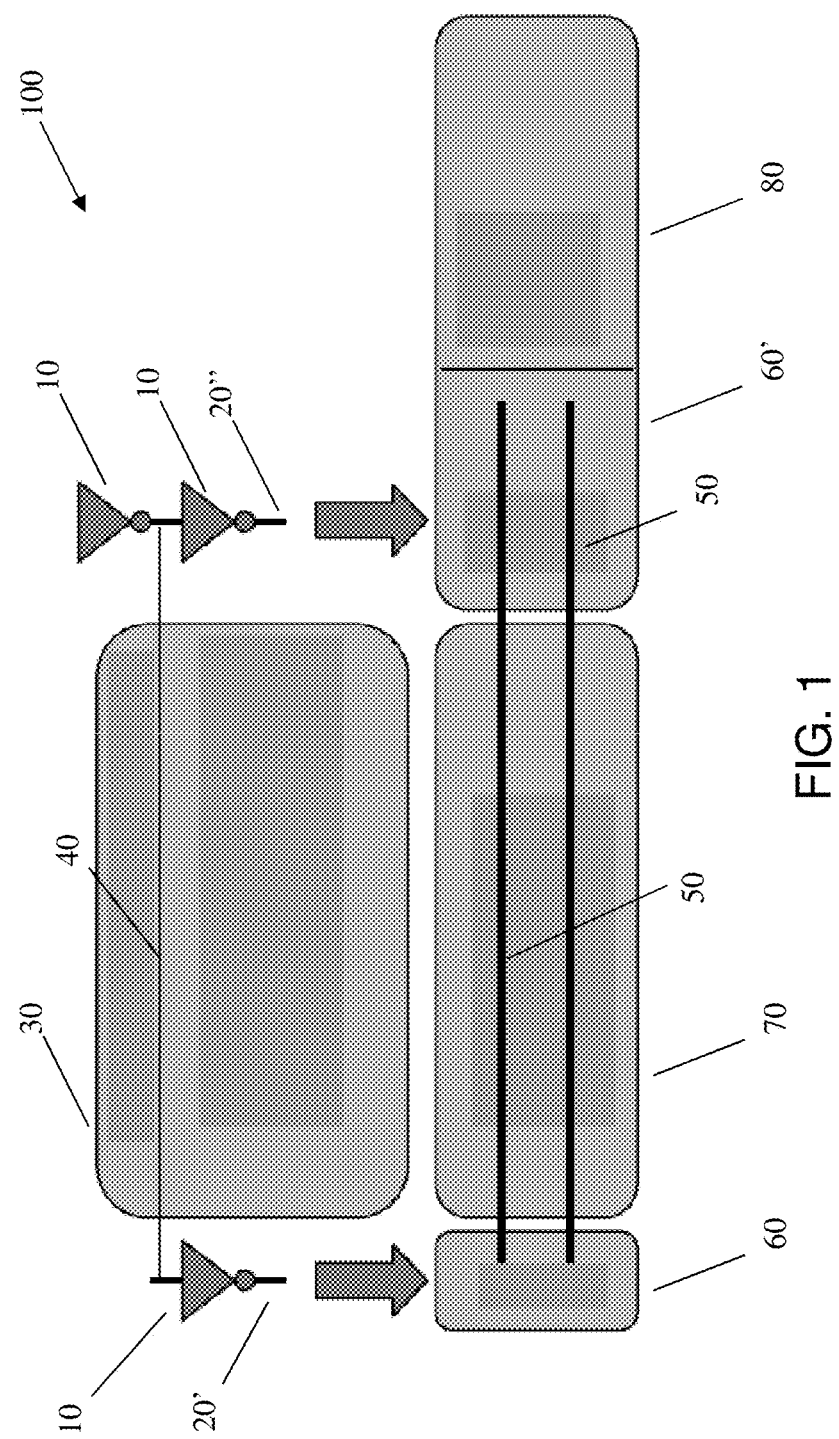
FIG. 1 shows a write scheme with a dual write bit switch (DWBS) structure in accordance with aspects of the present disclosure.

FIG. 1 shows a write scheme with a dual write bit switch (DWBS) structure in accordance with aspects of the present disclosure. In FIG. 1, a dual write bit switch structure 100 includes parallel inverters 10 connected through an inverted write bit switch signal 40. Further, a first write bit switch signal 20' and a second write bit switch signal 20" are connected to a corresponding inverter of the parallel inverters 10. In FIG. 1, the inverted write bit switch signal 40 is routed over a word line driver 30. Further, a digit line true write line (DLTW)/a digit line complement write line (DLCW) 50 is routed over a memory cell array 70. A first write bit switch 60 is connected to a second write bit switch 60' through parallel DLTW/DLCW lines 50. Finally, the second write bit switch 60' is serially connected to a write driver 80.

In FIG. 1, the memory cell array 70 is connected to two write bit switch devices 60, 60' through parallel signal lines. Each of the two write bit switch devices 60, 60' are at different locations of the memory cell array 70. In embodiments, for example, one of the two write bit switch devices 60 is located at a near side of the memory cell array 70; whereas the other of the two write bit switch devices 60' is located at a far side of the memory cell array 70. Accordingly, in one example, one of two write bit switch devices 60 is at a bit slice of the memory cell array 70 and the other of the two write bit switch devices 60' is at an array edge of the memory cell array 70. In particular, the memory cell array 70 is connected to the two write bit switch devices 60, 60' through at least one digit line true write line (DLTW)/digit line complement write line (DLCW) 50. In embodiments, the connection can be a controlled collapse chip connection (C4); although other solder or pillar connections are contemplated herein.

In embodiments, in FIG. 1, the memory cell array 70 is connected to the two write bit switch devices 60, 60' through two DLTW/DLCW lines 50. Further the DLTW/DLCW lines 50 route over the memory cell array 70 and are shielded by supplies (e.g., w-40 nm/s-80 nm). One of ordinary skill in the art would understand that any number of DLTW/ DLCW lines can be used to connect the memory cell array 70 to the two write switch devices 60, 60'.

In FIG. 1, a write bit switch device 60' of the two write bit switch devices 60, 60' is serially connected to a write driver 80. In one example, the write bit switch device 60' is serially connected to the write driver 80 through a pass gate. The write driver 80 can perform write operations for the memory cell array 70. Further, the inverted write bit switch signal 40 is routed over the word line driver 30 and is buffered at an array edge (e.g., w-80 nm/s-80 nm). In particular, the inverted write bit switch signal 40 is inverted on both sides by the inverters 10 to create two write bit switch signals 20' and 20". Then, the two write bit switch signals 20', 20" are applied to each of the two write bit switch devices 60, 60' to turn each of the two write bit switch devices 60, 60' in the on state.

In FIG. 1, before a write operation is performed, the DLTW/DLCW lines 50 will be setup prior to an arrival of a write bit switch clock signal. In comparison to using only one write bit switch, the present disclosure uses an additional RC loading on DLTW/DLCW lines 50. Therefore, the DLTW/DLCW lines 50 will have an increased setup time for write data in comparison to schemes in which only one write bit switch is used; however, since the setup time for write data is usually fairly low, the increased setup time penalty can easily be absorbed. Further, the additional area for adding the second write bit switch device 60' is small (e.g., approximately 20 PC's or 1.12u).

Still referring to FIG. 1, before a write operation, the data of the DLTW/DLCW lines 50 will be setup during a write data setup time. Then, after the data of the DLTW/DLCW lines 50 are setup, a write bit switch clock arrives and a write operation is performed by the write driver 80. During the write operation, an inverted write bit switch signal 40 is routed over the word line driver 30 and buffered through inverters 10. As a result of the inverted write bit switch signal 40 being inverted through inverters 10, the write bit switch signal 20' or 20" can be passed to the two write bit switch devices 60, 60' at the bit slice and the array edge of the memory cell array 70 to turn on the two write bit switch devices 60, 60'. Lastly, the write operation is completed in the memory cell array 70 after the DLTW/DLWC lines 50 are routed over the memory cell array 70. Based on a typical write operation, the dual write bit switch structure 100 in FIG. 1 improves a cell write time by 64% compared to using only one write bit switch.

Figure 2:
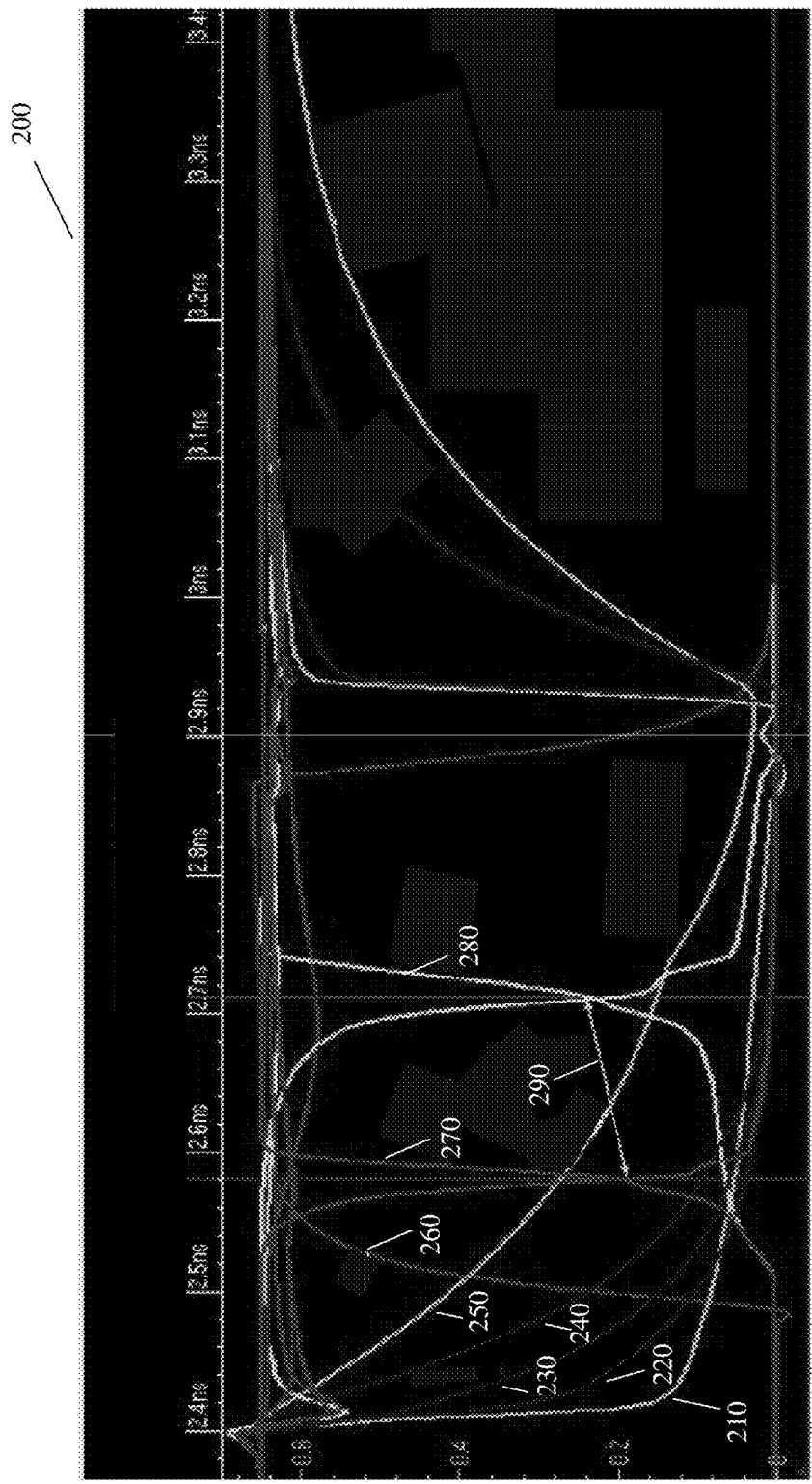
FIG. 2 shows a graph of the DWBS structure in accordance with aspects of the present disclosure.

FIG. 2 shows a graph of the DWBS structure in accordance with aspects of the present disclosure. In FIG. 2, the graph 200 of the DWBS structure 100 shows the x-axis in nanoseconds from about 2.4 nanoseconds to about 3.4 nanoseconds. Further, the y-axis is in volts from about 0 volts to about 0.6 volts. The graph 200 includes write waveforms of a known single write bit switch and write waveforms of a dual write bit switch.

In particular, the graph 200 includes a near bit line complement (NBLC) of the known single write bit switch 210, a near bit line complement (NBLC) of the dual write bit switch 220, a far bit line complement (FBLC) of the dual write bit switch 230, a midpoint bit line complement (MBLC) of the dual write bit switch 240, and a far bit line complement (FBLC) of the known single write bit switch 250. A word line 260, a data line of the dual write bit switch 270, and a data line of the known single write bit switch 280 are also shown.

In embodiments, the near bit line complement (NBLC) of the known write bit switch 210 and the dual write bit switch 220 is a complement bit line signal which is near the write bit switch device. Further, the far bit line complement (FBLC) of the dual write bit switch 230 and the known signal write bit switch 250 is a complement bit line signal, which is far away from the write bit switch device. The midpoint bit line complement (MBLC) of the dual write bit switch 240 refers to a complement bit line signal which is at a midpoint between the NBLC and the FBLC.

In FIG. 2, after a write operation is performed, the value of the data line of the dual write bit switch 270 in a cell of the memory array 70 changes a binary value (e.g., from a binary value of "0" to a binary value of "1"). Therefore, as shown in FIG. 2, the data line of the dual write bit switch 270 as implemented in the DWBS structure 100 changes a data value in approximately 76 picoseconds after a write operation is started. In contrast, the data line of a single write bit switch 280 of a conventional structure changes a data value in approximately 210 picoseconds. Therefore, the data line of the dual write bit switch 270 changes the data value approximately 64% faster than the change of data in the data line of the single write bit switch 280. As shown in FIG. 2, a difference between the data line of the dual write bit switch 270 changing and the data line of the known single write bit switch 280 is illustrated by the difference 290.

Figure 3:
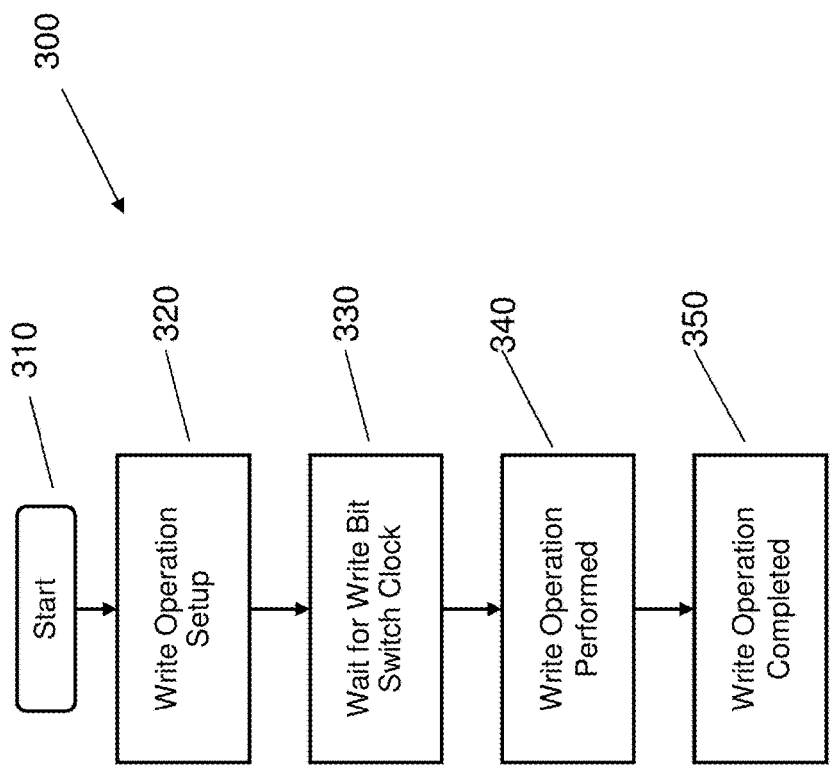
FIG. 3 shows a flowchart of a write operation using the DWBS structure in accordance with aspects of the present disclosure.

FIG. 3 shows a flowchart of a write operation using the DWBS structure in accordance with aspects of the present disclosure. The flow 300 for a write operation using the DWBS structure 100 starts at step 310. At step 320, the DLTW/DLCW lines 50 will be setup for a write operation. In particular, the data of the DLTW/DLCW lines 50 will be setup during a write data setup time. At step 330, the DWBS structure 100 waits for a write bit switch clock to start a write operation. At step 340, the write operation is performed using the write driver 80. During the write operation, the inverted write bit switch signal 40 is routed over the word line driver 30 and then buffered through inverters 10. As a result of the inverted write bit switch signal 40 being inverted through inverters 10, the write bit switch signals 20', 20" can be applied to the two write bit switch devices 60, 60' to turn on the two write bit switch devices 60, 60'. In particular, the two write bit switch devices 60, 60' include a first bit switch device 60 at a bit slice of the memory cell array 70 and a second bit switch device 60' at an array edge of the memory cell array 70. Finally, at step 350, the write operation is completed in the memory cell array 70 after the DLTW/DLCW lines 50 are routed over the memory cell array 70.

The circuit and method for a dual write bit switch structure of the present disclosure can be manufactured in a number of ways using a number of different tools. In general, though, the methodologies and tools are used to form structures with dimensions in the micrometer and nanometer scale. The methodologies, i.e., technologies, employed to manufacture the circuit and method for a dual write bit switch structure of the present disclosure has been adopted from integrated circuit (IC) technology. For example, the structures are built on wafers and are realized in films of material patterned by photolithographic processes on the top of a wafer. In particular, the fabrication of the circuit and a method for a dual write bit switch structure uses three basic building blocks: (i) deposition of thin films of material on a substrate, (ii) applying a patterned mask on top of the films by photolithographic imaging, and (iii) etching the films selectively to the mask.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising a dual write bit switch device which comprises a plurality of bit switch devices positioned at different positions of a memory cell array, and which is configured to enable write operations at a specified number of cells per bit line of the memory cell array,
wherein the plurality of bit switch devices comprise a first bit switch device and a second bit switch device which are connected to the memory cell array through at least one digit write line.

2. The structure of claim 1, wherein the first bit switch device is positioned at a bit slice of the memory cell array and the second bit switch device is positioned at an array edge of the memory cell array.

3. The structure of claim 2, further comprising a write driver which is configured to perform write operations at the memory cell array.

4. The structure of claim 3, wherein the write driver is connected to one of the first bit switch device and the second bit switch device through a pass gate.

5. The structure of claim 1, further comprising a word line driver which is configured to drive a plurality of write bit switch lines for the dual bit switch device.

6. The structure of claim 5, wherein the word line driver is further configured to drive the plurality of write bit switch lines for the dual bit switch device using a plurality of inverters.

7. The structure of claim 1, wherein the at least one digit write line is routed from the dual bit switch device to the memory cell array in a controlled collapse chip connection (C4).

8. The structure of claim 1, wherein the memory cell array is part of a static random access memory (SRAM).

9. A structure comprising a dual write bit switch device which includes a first bit switch device and a second bit switch device positioned at different locations with respect to a memory cell array, the dual bit switch device being configured to enable write operations at a specified number of cells per bit line of the memory cell array in a static random access memory (SRAM),
wherein the first bit switch device and the second bit switch device are connected to the memory cell array through at least one digit write line.

10. The structure of claim 9, wherein the first bit switch device is positioned at a bit slice of the memory cell array and the second bit switch device is positioned at an array edge of the memory cell array.

11. The structure of claim 10, further comprising a write driver which is configured to perform write operations at the memory cell array.

12. The structure of claim 11, wherein the write driver is connected to one of the first bit switch device and the second bit switch device through a pass gate.

13. The structure of claim 9, further comprising a word line driver which is configured to drive a plurality of write bit switch lines for the dual bit switch device.

14. The structure of claim 13, wherein the word line driver is further configured to drive the plurality of write bit switch lines for the dual bit switch device using a plurality of inverters.

15. The structure of claim 13, wherein the word line driver is further configured to drive the plurality of write bit switch lines for the dual bit switch device in a controlled collapse chip connection (C4).

16. The structure of claim 9, wherein the at least one digit write line is routed from the dual bit switch device to the memory cell array in a controlled collapse chip connection (C4).

17. A method, comprising:
setting up at least one write operation for a dual write bit switch device; and
performing the at least one write operation at a specified number of cells per bit line of a memory cell array after setting up of the at least one write operation for the dual write bit switch device,
wherein the dual write bit switch device comprises a first bit switch device and a second bit switch device which are connected to the memory cell array through at least one digit write line.

18. The method of claim 17, further comprising receiving a write bit switch clock before performing the at least one write operation.

19. The method of claim 17, wherein the first bit switch device is positioned at a bit slice of the memory cell array and the second bit switch device is positioned at an array edge of the memory cell array to speed up the at least one write operation.

20. The method of claim 17, wherein the memory cell array is part of a static random access memory (SRAM).

* * * * *